United States Patent

Matsuoka et al.

[11] Patent Number: 5,310,350
[45] Date of Patent: May 10, 1994

[54] CONNECTOR

[75] Inventors: Noriyuki Matsuoka, Yokohama; Masanori Egawa, Sendai, both of Japan

[73] Assignee: Yamaichi Electric Co., Ltd., Tokyo, Japan

[21] Appl. No.: 102,959

[22] Filed: Aug. 6, 1993

Related U.S. Application Data

[63] Continuation of Ser. No. 857,870, Mar. 26, 1992, abandoned.

Foreign Application Priority Data

Mar. 27, 1991 [JP]    Japan ................................ 3-87483

[51] Int. Cl.⁵ ............................................ H01R 9/09
[52] U.S. Cl. ...................................... 439/72; 439/525
[58] Field of Search ................................ 439/68–73, 439/330, 331, 264, 525, 526, 404

[56]         References Cited
          U.S. PATENT DOCUMENTS

| | | | |
|---|---|---|---|
| Re. 32,370 | 3/1987 | Bright et al. ........................ | 439/68 |
| 4,669,799 | 6/1987 | Vachhani et al. ................... | 439/404 |
| 4,678,255 | 7/1987 | Carter ................................ | 439/71 |
| 4,758,176 | 7/1988 | Abe et al. .......................... | 439/331 |
| 5,000,696 | 3/1991 | Matsuoka et al. .................. | 439/331 |

FOREIGN PATENT DOCUMENTS 2-31790  8/1990  Japan .

*Primary Examiner*—Larry I. Schwartz
*Assistant Examiner*—Hien D. Vu
*Attorney, Agent, or Firm*—Wenderoth, Lind & Ponack

[57] ABSTRACT

In a connector having a group of contacts arrayed at narrow pitches on a base member, a contact fixture device is formed separately from the base member forming a connector body. The contact fixture device is provided with retaining claws adapted to secure the fixture device to the base member. The contact fixture device is further provided with a presser portion disposed across a group of seat elements of the group of contacts. The presser portion is laid across the group of seat elements to urge the group of seat elements against a surface of the base member when the fixture device is secured to the base member with the retaining claws. In this manner, the group of contacts can be arrayed on the base member.

2 Claims, 4 Drawing Sheets

CONNECTOR

This application is a continuation of now abandoned application, Ser. No. 07/857,870, filed on Mar. 26, 1992.

BACKGROUND OF THE INVENTION

1. Field of the Invention

This invention relates to a connector having a number of contacts arrayed at narrow pitches on a base member, and particularly to an array structure of a group of contacts on the base member.

2. Brief Description of the Prior Art

The conventional mount-to-contact type IC socket as represented by Japanese Utility Model Publication No. Hei 2-31790 has a structure in which each contact has a horizontal U-shaped contact element, an upper U-curved element of the horizontal U-shaped contact element is formed as a contact element on which a terminal of an IC is to be mounted for contact, and a lower U-curved element thereof is formed as a seat element received on an upper surface of a base member. For each of the contact elements, a male terminal extending downward from the seat element is preliminarily pressingly fitted in an implanting hole formed in the base member, and a press-fit claw disposed at a basal portion of the male terminal is caused to bite into an inner wall of the implanting hole thereby providing an array structure of a plurality of contacts arranged at narrow pitches on the base member.

In recent years, as the manufacturing technique progresses, IC's are increased in pole number and miniaturized. Therefore, IC's of narrow pitches, in which IC terminals are arranged at 0.2 mm pitches or at similar pitches, are commercially available. Therefore, sockets which are suitable for such IC's are demanded. Especially, a group of contacts arrayed on a socket are required to be implanted at narrow pitches so as to correspond to the narrow pitches of the IC terminals. This naturally follows that the pitches of the implanting holes of the contacts are required to be reduced, and the sizes of the contacts are required to be more and more miniaturized.

However, the conventional structure, in which contact implanting holes are preliminarily formed in a base member and male terminals of contacts are press fitted therein, has the following problems. By reason of the reduced pitches of the contact implanting holes, the thickness of a wall between adjacent contact implanting holes becomes extremely thin, and is therefore difficult to shape. Even if shaping is possible, a wall having a thickness sufficient to bear the press-fit of a press-fit claw is unobtainable. On the contrary, the male terminals become thinner and thinner as the miniaturization of contacts progresses and a sufficient amount of projection of the press-fit claw is difficult to obtain. As a result, it is difficult to provide a claw which is sufficiently strong to bear the press-fit.

SUMMARY OF THE INVENTION

It is therefore an object of the present invention to provide a connector which is capable of fundamentally solving the above-mentioned problems.

As means for solving the problems, in a connector having a group of contacts arrayed at narrow pitches on a base member, a contact fixture device is formed separately from the base member forming a connector body, and the contact fixture device is provided with retaining claws adapted to secure the fixture device to the base member. The contact fixture device is provided with a presser portion disposed across a group of seat elements of the group of contacts. The presser portion is laid across the group of seat elements to urge the group of seat elements against a surface of the base member when the fixture device is secured to the base member with the retaining claws. In this manner, the group of contacts is arrayed on the base member.

As another means for solving the above problems according to the present invention, each of the seat elements is projected forward and backward from a basal portion of a contact element of each contact. The contact fixture device is provided with a front presser portion disposed across the group of front seat elements and a rear presser portion disposed across the group of rear seat elements, and the front and rear presser portions are laid across the groups of front and rear contact elements to urge the front and rear seat elements against a surface of the base member when the fixture device is secured to the base member with the retaining claws. In this manner, the group of contacts is arrayed on the base member.

As a further means for solving the above problems according to the present invention, a pair of the fixture devices are formed, one of the fixture devices having a front presser portion laid across the group of front seat elements to urge the front seat elements against the base member, and the other of the fixture devices having a rear presser portion laid across the group of rear seat elements to urge the rear seat elements against the base member. In this manner, the group of contacts is arrayed on the base member.

According to the present invention, by securing the fixture device to the base member with the retaining claws, the presser portion disposed across the group of seat elements received on the base member urges the group of seat elements against the receiving surface of the base member, such that the group of contacts can be collectively mounted on the base member.

Since the group of contacts can be collectively mounted on the base member by using the presser portion of the fixture device disposed across the group of seat elements to urge downwardly against the group of seat elements, which are preliminarily received on the base member, there can be provided a simple structure in which the base member, the group of seat elements received on the base member, and the fixture device for urging the group of seat elements against the receiving surface operate to stably and firmly secure the contacts to the surface of the base member. Moreover, assembly of the group of contacts onto the base member is very easy.

According to the present invention, the conventional structure, in which a group of contacts must be press fitted into implanting holes by use of press-fit claws in order to attain a required strength, is unnecessary. Therefore, the above problems inherent in the conventional structure are obviated.

The above and other objects and features of the present invention will become more manifest to those skilled in the art upon a reading of the detailed description of the invention with reference to the accompanying drawings.

DETAILED DESCRIPTION OF THE INVENTION

Figure 1:
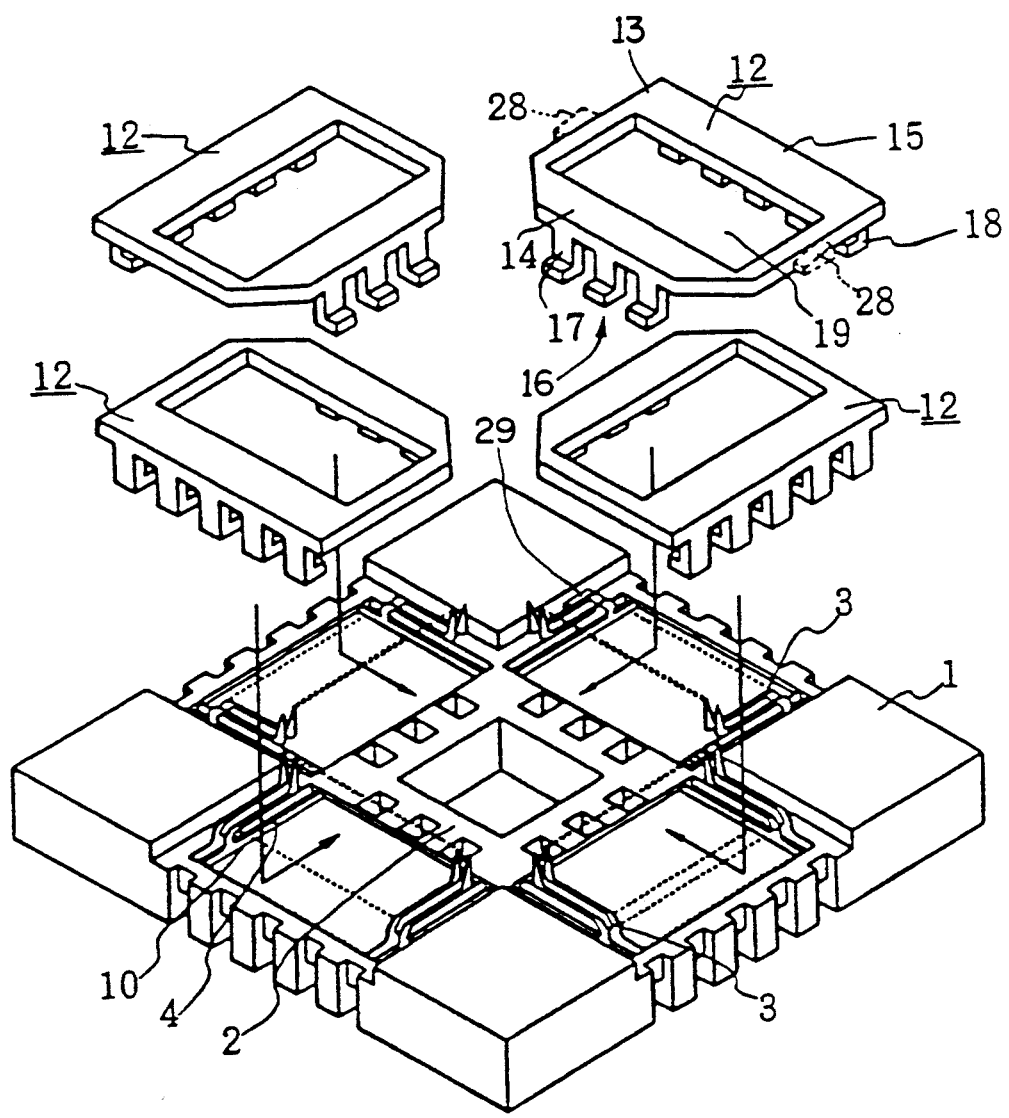
FIG. 1 is a perspective view showing a connector according to a first embodiment of the present invention, with contact fixture devices exploded therefrom.

The present invention will be described hereinafter with reference to FIGS. 1 through 8 of the accompanying drawings.

FIRST EMBODIMENT

FIGS. 1 through 6

The numeral 1 denotes a generally rectangular base member forming a connector body. The base member 1 is formed from an insulating material and has at a central portion thereof an accommodation portion 2 for accommodating therein an electric part such as an IC, etc. A number of contacts 3 are disposed in outer regions of at least two opposing sides of the electric part accommodation portion 2 and arrayed at narrow pitches along the two opposing sides.

The contacts 3 have seat elements 4 received on the upper surface of the base member 1 in parallel relation with one another and extending in a forward and backward direction. The contact 3 also has a male terminal 5 extending downwardly from the seat element 4, and a contact element 6 extending upwardly from the seat element 4 and further extending forwardly. A free end of the contact element 6 terminates in a contact end 7 on which a terminal of an electric part accommodated in the accommodation portion 2 is to be mounted for contact.

A direction perpendicular to the arraying direction of the group of contacts is herein referred to as a forward and rearward (or backward) direction. In the illustrated embodiment, therefore, the IC accommodation portion 2 can be referred to as being located forward of the contacts 3 and the portion of the base member 1 located on a side of the contacts 3 opposite the accommodation portion 2 can be referred to as being located rearward of the contacts 3.

Each of the seat elements 4 consists of a front seat element (or portion) 8 extending forward from a basal portion of the contact element 6, and a rear seat element (or portion) 9 extending backward therefrom. The base member 1 is also provided, as means for stably receiving the contacts on the surface of the base member 1, with a plurality of shallow regulation grooves 10 cut into its surface externally of the IC accommodation portion 2 and extending forwardly and backwardly in parallel relation with each other. Grooves 10 are formed in the surface of the base member 1, and the seat elements 4 are fitted into the grooves 10 such that they are received on and supported by the bottom faces of the grooves 10, with upper edges of the seat elements 9 projecting slightly above the open tops of the grooves 10.

Each of the regulation grooves 10 is provided with a through-hole 11 formed in the bottom face thereof, i.e., the seat element receiving face. The male terminal 5 is loosely inserted all the way through the through-hole 11 such that the terminal 5 projects below a lower surface of the base member 1, with the seat element 4 being supported by the bottom face of the groove 10. The male terminal 5 is loosely, but with almost no play, inserted into the through-hole 11, or otherwise it is inserted into the through-hole 11 with an auxiliary weak press-fit force.

The seat elements 4 of the contacts 3 are supported by the bottom faces of the regulation grooves 10 and the side faces of the seat elements 4 are positioned by walls defining the grooves 10. The contacts 3 are held in their upstanding posture by loosely inserting the male terminal thereof into the through-holes 11. Thereby, the contacts 3 are temporarily assembled in predetermined positions with prescribed postures.

Figure 2:
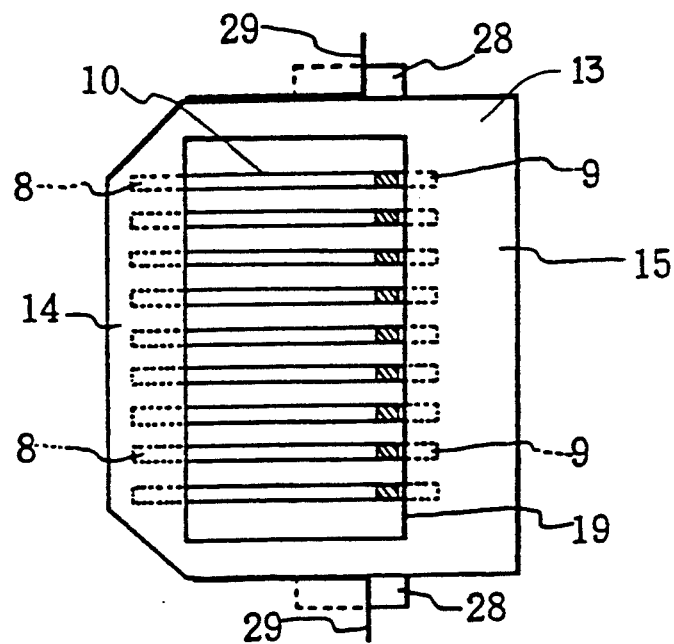
FIG. 2 is a plan view of a base member to which a group of contacts are pressed by the contact fixture devices such that the contacts are arrayed on the base member.
Figure 3:
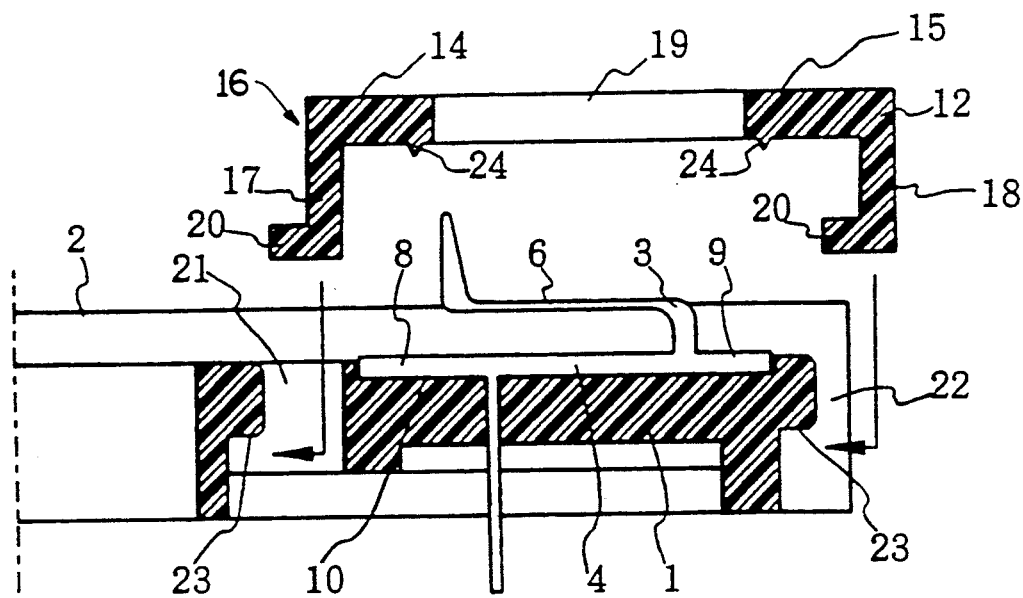
FIG. 3 is a sectional view of an important portion of the connector in which the contact fixture device is not yet secured to the base member.

A contact fixture device 12 is formed on the base member 1 as a means for integrally assembling the group of contacts 3 on the surface of the base member 1. The fixture member 12 is made from a synthetic resin material. The fixture device 12 has a presser portion 13 extending across each group of the seat elements 4 and a retaining claw 16 adapted to secure the fixture device 12 to the base member 1. When the fixture device 12 is secured to the base member 1 by the retaining claw 16, the presser portion 13 is laid across the group of seat elements 4, as shown in FIG. 2, to urge the seat elements 4 against the surface of the base member 1, i.e., against the bottom faces of the regulation grooves 10, such that the group of contacts 3 is arrays on the base member 1.

In the illustrated embodiment, the fixture device 12 has a front presser portion 14 extending across the group of front seat elements 8 and a rear presser portion 15 extending across the group of rear seat elements 9, so that when the fixture device 12 is secured to the base member 1 by the retaining claw 16, the front and rear presser portions 14, 15 are laid across the front and rear seat elements 8, 9, as mentioned above, to urge the seat elements 8, 9 against the surface of the base member 1, i.e., against the bottom faces of the regulation grooves 10, such that the group of contacts 2 is arrayed on the base member 1.

Figure 4:
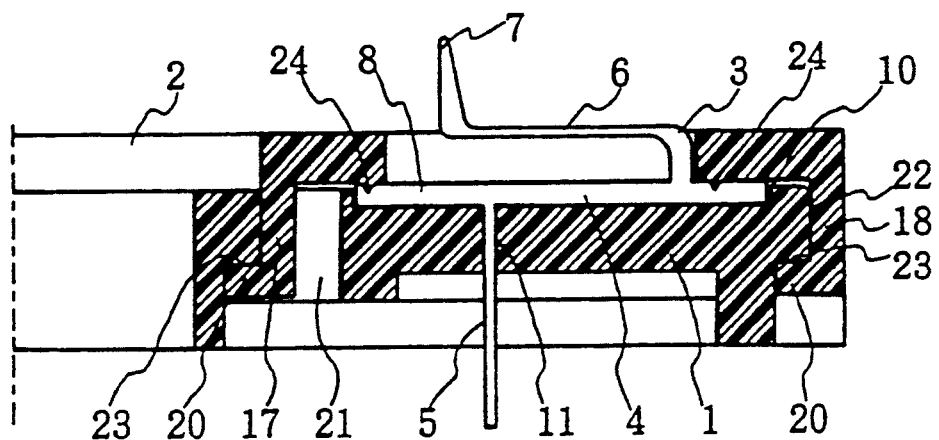
FIG. 4 is a sectional view of an important portion of the connector in which the contact fixture device is secured to the base member so that a group of contacts are pressed to the base member.

The front presser portion 14 and the rear presser portion 15 are interconnected at both ends thereof to define a window 19 between the presser portions 14 and 15. In other words, the fixture device 12 forms a rectangular frame, and the front and rear presser portions 14, 15 form opposing frame plates which define the window 19. As is shown in FIG. 4, when the fixture device 12 is secured to the base member 1 by the retaining claw 16, the contact element 6 projects upward through the window 19.

The retaining claw 16 comprises a front retaining claw 17 projecting downward from the front presser portion 14, and a rear retaining claw 18 projecting downward from the rear presser portion 15. The retaining claws 17 and 18 are provided with claw tips 20, respectively, which project forward at generally right angles. The front retaining claws 17 are disposed along a front edge of the front presser portion 14 at equal distances. Likewise the rear retaining claws 18 are disposed along a rear edge of the rear presser portion 15 at equal distances.

On the other hand, the base member 1 is provided with front retaining recess portions 21 for receiving the front retaining claws 17 and rear retaining recess portions 22 for receiving the rear retaining claws 18. The front and rear retaining recess portions 21 and 22 are provided with step portions 23, respectively, by which the claw tips 20 are retained. For example, a vertical retaining hole is formed in the surface of the base member 1 in front of the group of front seat elements 8 so that it may serve as the retaining recess portion 21. Similarly, a retaining hole is formed behind the rear seat elements 9. Otherwise, as illustrated, vertical retaining grooves are formed in a side face of the base member 1 behind the rear seat elements 9, so that they may serve as the retaining recess portions 22. The retaining portions 21 and 22 are formed in such a manner as to correspond to the retaining claws 17 and 18.

The respective retaining claws 17, 18 are generally vertically inserted into the corresponding retaining recess portions 21 22 from above the base member 1. By inserting the retaining claws 17, 18 into the retaining recess portions 21, 22, the presser portions 14, 15 are disposed across the upper surfaces of the groups of seat elements 8, 9. After insertion of the retaining claws 17, 18, by sliding the fixture device 12 forward along the upper surfaces of the seat elements 8, 9, the claw tips 20 are firmly retained by the step portions 23 and the fixture device 12 is secured to the base member 1. When the fixture device 12 is slid forward, the presser portions 14, 15 guide the forward sliding movement of the fixture device 12 while being slid on the surfaces of the seat elements 8, 9. Because of the retention of the claw tips 20 by the step portions 23, the presser portions 14, 15 disposed across the groups of seat elements 8, 9 urge the seat elements 8, 9 against the surface of the base member 1 in order to firmly secure the seat elements 8, 9 thereto. By this, the contacts 3 are integrally assembled on the base member 1 in an array pattern.

Figure 5:
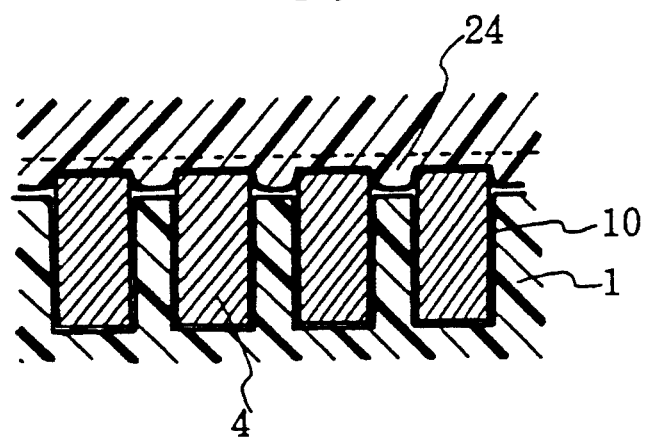
FIG. 5 is a sectional view of an important portion of the connector in which a group of seat elements of the group of contacts bite into a rib disposed at the contact fixture device in order to press the group of contacts.
Figure 6:
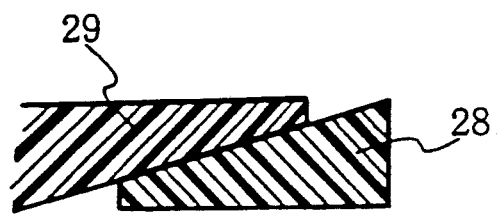
FIG. 6 is a sectional view of a means for urging the contact fixture device downwardly toward the surface of the base member.

As one means for ensuring a firmer securement of the groups of seat elements 8, 9 by the presser portions 14, 15, for example, ribs 24 may be disposed on lower surfaces of the presser portions 14, 15, i.e., on surfaces disposed across the groups of seat elements 8, 9, in such a manner as to extend across the groups of seat elements 8, 9. As mentioned above, seat elements project slightly above the upper edges of the regulation grooves 10. Therefore, when the retaining claws 17, 18 are retained by the step portions 23, the upper edges of the seat elements bite into the ribs 24, as shown in FIG. 5, such that the seat elements are more firmly secured to the base member 1.

As another means for ensuring a firmer securement of the group of seat elements 8, 9 by the presser portions 14, 15, fastening elements 28, which are indicated by imaginary lines in FIG. 1, are disposed at two sides of the fixture device 12, respectively, and retaining portions 29 are disposed on the base member 1 retaining surfaces of the retaining portions 29 and/or the fastening elements 28 are formed as inclined surfaces, so that the retaining surfaces of the fastening elements 28 will slide along the retaining surfaces of the retaining portions 29 upon a sliding movement of the fixture device 12 in a forward direction, and will cause the presser portions 14, 15 of the fixture device 12 to press downwardly against the seat elements 8, 9 of the contacts 3. That is, because of the retention of the fastening elements 28 by the retaining portions 29, a downward force is exerted by the presser portions 14, 15, so that the seat elements 8, 9 are more firmly urged against the surface of the base member 1 (bottom faces of the regulation grooves 10). If the ribs 24 are also provided, a biting into the group of seat elements is enhanced by the downward force due to the fastening elements 28 and retaining portions 29.

In the first embodiment, although each fixture device is provided with a presser portion 13 comprising a front presser portion 14 and a rear presser portion 15, a single presser portion may be provided depending on the shapes of the contacts 3.

SECOND EMBODIMENT

Figure 7:
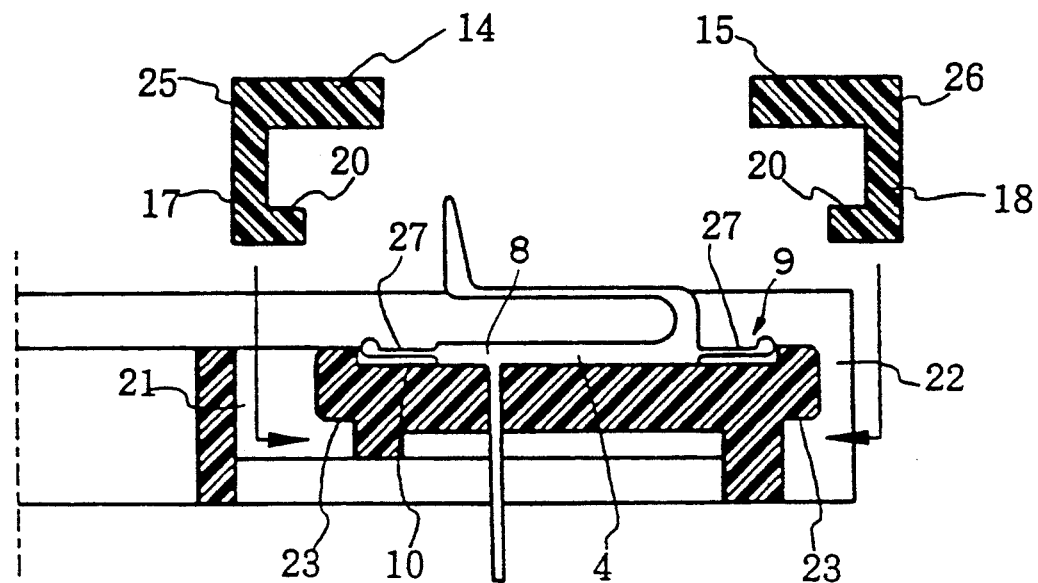
FIG. 7 is a sectional view of an important portion of the connector according to another embodiment of the present invention, in which a contact fixture device is not yet secured to a base member.
Figure 8:
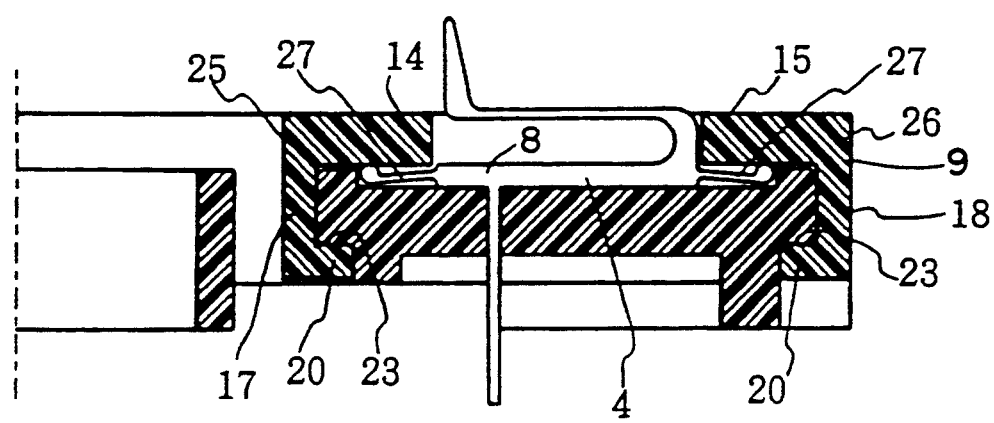
FIG. 8 is a sectional view of an important portion of the connector of FIG. 7, in which the contact fixture device is secured to the base member in order to press the group of contacts to the base member such that the group of contacts are arrayed on the base member.

FIGS. 7 and 8

In the second embodiment, the contact fixture device 12 of the first embodiment is divided into two parts; one as a front fixture device 25 and the other as a rear fixture device 26. The front fixture device 25 is provided with a front presser portion 14 disposed across the group of front seat elements 8, and the rear fixture device 26 is provided with a rear presser portion 15 disposed across the group of rear seat elements 9. The fixture devices 25, 26 are provided with corresponding front and rear retaining claws 17, 18, respectively, for securing the respective fixture devices to the base member 1, so that when the fixture devices 25, 26 are secured to the base member 1 by the retaining claws 17, 18, the front and rear presser portions 14, 15 will be laid across the groups of front and rear seat elements 8, 9 to urge the seat elements 8, 9 against the surface of the base member, to thereby array the contacts 3 on the base member 1.

The retaining claws 17 formed on the front fixture device 25 project backward at its claw tip 20, while the retaining claw 18 formed on the rear fixture device 26 projects forward at its claw tip 20. The front fixture device 25 is operated by sliding it rearwardly to press downwardly against the group of front seat elements, while the rear fixture device 26 is operated by sliding it forwardly to press downwardly against the group of rear seat elements.

As one means for firmly pressing the group of seat elements 4 to the surface of the base member 1, each of the seat elements 4 is provided with a vertically displaceable elastic seat element portion 27 as shown in FIG. 7, so that the elastic seat element portion 27 can be pressed downwardly by the presser portion 13 as shown in FIG. 8.

As shown in the first and second embodiments, one fixture device 12 is provided for each group of contacts arrayed along a side of the electric part accommodation portion 2. That is, where contacts groups are arrayed along two opposing sides of the electric part accommodation portion 2, two fixture devices are provided, and where contacts groups are arrayed along four sides, four fixture devices are provided. Each of the fixture devices may have the same configuration and can be used interchangeably among the groups of contacts.

Although not shown, the fixture devices may initially be formed integrally and then separated into individual fixture devices. That is, two or four fixture devices may be formed integrally together from a synthetic resin material, and two or four groups of contacts may be collectively and simultaneously implanted in the surface of the base member. In that case, all of the claw tips of the retaining claws may be projected in a direction such that the fixture devices are retained by laterally sliding them into position.

According to the present invention, by using the retaining claw to secure the fixture device to the base member, the presser portion is laid across the group of seat elements received on the based member to urge the seat elements against the receiving surface, such that the group of contacts can be collectively mounted on the base member.

Since the group of contacts can be collectively mounted on the base member by urging the group of seat elements, which are preliminarily received on the surface of the base member, against the receiving surface through the presser portion of the fixture device disposed across the group of seat elements, there can be provided a simple structure in which the base member, the group of seat elements received on the base member, and the fixture device for urging the seat elements to the receiving surface cooperate to stably and firmly secure the contacts to the surface of the base member. Moreover, assembly of the group of contacts onto the base member is very easy.

According to the present invention, the conventional structure, in which a group of contacts must be press fitted into implanting holes by use of a press-fit claw in order to attain a required strength, is unnecessary. Thus, the above problems inherent in the conventional structure are obviated.

Although preferred embodiments of the present invention have been described, it should be understood that the invention is by no means limited to these embodiments. Numerous changes and modifications of the invention will occur to those skilled in the art without departing from the spirit and scope of the invention.

What is claimed is:

1. A connector comprising:
   a base member having an upper surface with a front end and a rear end;
   a plurality of contacts arrayed in parallel relation with one another atop said upper surface of said base member, each of said contacts including a seat portion received on said upper surface of said base member and a contact portion extending upwardly from said seat portion;
   wherein said contact portions of said contacts include basal portions at which said contact portions connect with said seat portions, respectively;
   wherein said seat portions of said contacts comprise front seat portions extending forwardly of said basal portions, respectively, and rear seat portions extending rearwardly of said basal portions, respectively;
   wherein a front fixture device is provided and includes a front retaining claw engaged with said base member to secure said front fixture device to said base member, and a front presser portion laid on and across said front seat portions of said contacts such that said front seat portions are firmly sandwiched between said front presser portion of said front fixture device and said upper surface of said base member;
   wherein a rear fixture device is provided and includes rear retaining claw engaged with said base member to secure said rear fixture device to said base member, and a rear presser portion laid on and across said rear seat portions of said contacts such that said rear seat portions are firmly sandwiched between said rear presser portion of said rear fixture device and said upper surface of said base member;
   wherein said front presser portion has a front rib formed thereon, said front rib protruding downwardly from a lower surface of said front presser portion and extending across said front seat portions of said contacts, such that upper surfaces of said front seat portions bite into said front rib to enhance pressing engagement between said front seat portions and said front presser portion; and
   wherein said rear presser portion has a rear rib formed thereon, said rear rib protruding downwardly from a lower surface of said rear presser portion and extending across said rear seat portions of said contacts, such that upper surfaces of said rear seat portions bite into said rear rib to enhance pressing engagement between said rear seat portions and said rear presser portion.

2. A connector comprising:
   a base member having an upper surface with a front end and a rear end;
   a plurality of contacts arrayed in parallel relation with one another atop said upper surface of said base member, each of said contacts including a seat portion received on said upper surface of said base member and a contact portion extending upwardly from said seat portion;
   wherein said contact portions of said contacts include basal portions at which said contact portions connect with said seat portions, respectively;
   wherein said seat portions of said contacts comprise front seat portions extending forwardly of said basal portions, respectively, and rear seat portions extending rearwardly of said basal portions, respectively;
   wherein a front fixture device is provided and includes a front retaining claw engaged with said base member to secure said front fixture device to said base member, and a front presser portion laid on and across said front seat portions of said contacts such that said front seat portions are firmly sandwiched between said front presser portion of said front fixture device and said upper surface of said base member;
   wherein a rear fixture device is provided and includes a rear retaining claw engaged with said base member to secure said rear fixture device to said base member, and a rear presser portion laid on and across said rear seat portions of said contacts such that said rear seat portions are firmly sandwiched between said rear presser portion of said rear fixture device and said upper surface of said base member;

wherein said front seat portions of said contacts respectively include front elastic elements engaged between said front presser portion of said front fixture device and said upper surface of said base member, said front elastic elements being adapted to be vertically displaced by said front presser portion to enhance pressing engagement between said front seat portions and said front presser portion; and wherein said rear seat portions of said contacts respectively include rear elastic elements engaged between said rear presser portion of said rear fixture device and said upper surface of said base member, said rear elastic elements being adapted to be vertically displaced by said rear presser portion to enhance pressing engagement between said rear seat portions and said rear presser portion.

* * * * *